US012770886B2

(12) United States Patent
Im et al.

(10) Patent No.: US 12,770,886 B2
(45) Date of Patent: Oct. 20, 2026

(54) CURRENT COLLECTOR FOR ANODE-FREE ALL-SOLID-STATE BATTERY AND ANODE-FREE ALL-SOLID-STATE BATTERY INCLUDING THE SAME

(71) Applicants: HYUNDAI MOTOR COMPANY, Seoul (KR); KIA CORPORATION, Seoul (KR); KOREA UNIVERSITY RESEARCH AND BUSINESS FOUNDATION, Seoul (KR)

(72) Inventors: Ga Hyeon Im, Hwaseong-si (KR); Hong Seok Min, Yongin-si (KR); Yun Sung Kim, Hwaseong-si (KR); Seung Ho Yu, Seoul (KR); Ji Hyun Lee, Seoul (KR); Beom Keun Cho, Seoul (KR); Hong Ju Lee, Seoul (KR)

(73) Assignees: HYUNDAI MOTOR COMPANY, Seoul (KR); KIA CORPORATION, Seoul (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 600 days.

(21) Appl. No.: 18/235,056

(22) Filed: Aug. 17, 2023

(65) Prior Publication Data

US 2024/0204201 A1 Jun. 20, 2024

(30) Foreign Application Priority Data

Dec. 19, 2022 (KR) ........................ 10-2022-0177948

(51) Int. Cl.
*H01M 4/66* (2006.01)
*C23C 14/22* (2006.01)
(Continued)

(52) U.S. Cl.
CPC ........... *H01M 4/667* (2013.01); *C23C 14/223* (2013.01); *C23C 14/34* (2013.01); *H01M 4/0404* (2013.01);
(Continued)

(58) Field of Classification Search
CPC .. H01M 4/667; H01M 4/0404; H01M 4/0426; H01M 4/661; H01M 4/669;
(Continued)

(56) References Cited

U.S. PATENT DOCUMENTS

2019/0379056 A1* 12/2019 Chen .................. H01M 10/052
2020/0131638 A1 4/2020 Cui et al.
(Continued)

FOREIGN PATENT DOCUMENTS

CN 112117437 A 12/2020
JP 5052074 B2 10/2012
(Continued)

*Primary Examiner* — James M Erwin
(74) *Attorney, Agent, or Firm* — MCDONNELL BOEHNEN HULBERT & BERGHOFF LLP

(57) ABSTRACT

A current collector for an anode-free all-solid-state battery is capable of effectively increasing a physical contact area between an electrolyte and a current collector and effectively reducing interfacial voids between the electrolyte and the current collector. In addition, an anode-free all-solid-state battery capable of stably increasing cycle life without over-voltage is provided.

14 Claims, 10 Drawing Sheets

(51) Int. Cl.

| | |
|---|---|
| ***C23C 14/34*** | (2006.01) |
| ***H01M 4/04*** | (2006.01) |
| ***H01M 10/0585*** | (2010.01) |
| *H01M 4/02* | (2006.01) |

(52) U.S. Cl.
CPC ......... *H01M 4/0426* (2013.01); *H01M 4/661* (2013.01); *H01M 4/669* (2013.01); *H01M 10/0585* (2013.01); *H01M 2004/021* (2013.01)

(58) Field of Classification Search
CPC ........ H01M 10/0585; H01M 2004/021; C23C 14/223; C23C 14/34
USPC ........................................................... 429/245
See application file for complete search history.

(56) References Cited

U.S. PATENT DOCUMENTS

| | | | | |
|---|---|---|---|---|
| 2020/0403230 | A1 | 12/2020 | Hong et al. | |
| 2021/0036327 | A1 | 2/2021 | Ogata et al. | |
| 2021/0265665 | A1* | 8/2021 | Kim | H01M 4/587 |
| 2022/0077469 | A1* | 3/2022 | Hwang | H01M 10/052 |
| 2022/0223868 | A1* | 7/2022 | Choi | H01M 4/667 |

FOREIGN PATENT DOCUMENTS

| | | | |
|---|---|---|---|
| KR | 2009-0121148 | A | 11/2009 |
| KR | 2012-0113182 | A | 10/2012 |
| KR | 2022-0020533 | A | 2/2022 |
| KR | 2022-0114916 | A | 8/2022 |

* cited by examiner

CURRENT COLLECTOR FOR ANODE-FREE ALL-SOLID-STATE BATTERY AND ANODE-FREE ALL-SOLID-STATE BATTERY INCLUDING THE SAME

CROSS REFERENCE TO RELATED APPLICATIONS

This application claims, under 35 U.S.C. § 119(a), the benefit of priority from Korean Patent Application No. 10-2022-0177948, filed on Dec. 19, 2022, the entire contents of which are incorporated herein by reference.

BACKGROUND

(a) Technical Field

The present disclosure relates to a current collector for an anode-free all-solid-state battery and an anode-free all-solid-state battery including the same.

(b) Background Art

Secondary batteries capable of being charged and discharged are used as energy sources not only for small electronic devices such as mobile phones, laptops, etc., but also for large vehicles such as hybrid vehicles, electric vehicles, etc. Accordingly, there is a need to develop secondary batteries having higher stability and energy density.

Conventional secondary batteries have technical limitations in improving stability and energy density because most cells are configured based on organic solvents (organic liquid electrolytes).

An all-solid-state battery using a solid electrolyte has been proposed in order to improve the stability of a secondary battery. Specifically, the all-solid-state battery may be configured to include a three-layer laminate composed of a cathode active material layer bonded to a cathode current collector, an anode active material layer bonded to an anode current collector, and a solid electrolyte interposed between the cathode active material layer and the anode active material layer.

In general, an anode active material layer in an all-solid-state battery is formed by mixing a solid electrolyte and an active material in order to attain ionic conductivity. Since the solid electrolyte has a higher specific gravity than the liquid electrolyte, the conventional all-solid-state battery has a lower energy density than a lithium ion battery.

Research into application of lithium metal as an anode has been carried out in order to increase the energy density of all-solid-state batteries, but practical problems such as interfacial junction, dendrite growth, price, difficulty in large-area formation, etc. are known.

These days, research into anode-free all-solid-state batteries is ongoing in order to improve the energy density of secondary batteries. During charging of an anode-free all-solid-state battery, lithium ions move from the cathode to the anode current collector, and the lithium ions on the surface of the anode current collector are converted into lithium metal through reduction reaction with electrons. During discharging, the opposite electrochemical reaction takes place. Briefly, the anode-free all-solid-state battery is a battery system capable of being charged and discharged without an anode active material. In order to reversibly charge and discharge an anode-free all-solid-state battery, lithium metal must be uniformly precipitated on the surface of the anode current collector inside the battery, and growth of lithium dendrites must be suppressed during charging.

Currently useful anode current collectors are manufactured using materials that do not react electrochemically with lithium ions and are lithiophobic. In this regard, a method of inducing uniform deposition of lithium on the surface of the anode current collector by applying a lithiophilic metal film capable of forming an alloy with lithium ions onto the surface of the anode current collector has been proposed. However, since voids inevitably exist between the solid electrolyte and the metal film due to the irregular particle size of the solid electrolyte and the hardness of the metal film, there is a technical limit in forming a uniform interface between the solid electrolyte and the metal film.

SUMMARY

An object of the present disclosure is to provide a current collector for an anode-free all-solid-state battery capable of increasing a physical contact area between an electrolyte and a current collector and reducing interfacial voids.

Another object of the present disclosure is to provide an anode-free all-solid-state battery capable of stably increasing cycle life without overvoltage.

A term "all-solid-state battery" as used herein refers to a rechargeable secondary battery that includes an electrolyte in a solid state. In certain embodiments, the all-solid state battery may be an anodeless all-solid-state battery.

A term "anode-free all-solid-state battery," "anodeless all-solid-state battery," "anode-free battery," or "anodeless battery" as used herein refers to an all-solid-state battery including a bare current collector at its anode side, which is in contrast to a battery that uses lithium metal or a layer including an anode active material and solid electrolyte as an anode. The anodeless all-solid-state battery may include a coating layer on the bare current collector containing materials that induce conduction of lithium ions to a surface of the bare current collector.

The objects of the present disclosure are not limited to the foregoing. The objects of the present disclosure will be able to be clearly understood through the following description and to be realized by the means described in the claims and combinations thereof.

An embodiment of the present disclosure provides a current collector for an anode-free all-solid-state battery, including an anode current collector and a metal nanoparticle layer disposed on one surface of the anode current collector.

The metal nanoparticle layer may include a lithiophilic metal.

The lithiophilic metal may be presence in a shape of particles in the metal nanoparticle layer.

The average particle diameter (D50) of the lithiophilic metal may be 50 to 200 nm.

The thickness of the metal nanoparticle layer may be 100 to 1000 nm.

The lithiophilic metal may include at least one of silver (Ag), magnesium (Mg), tin (Sn), bismuth (Bi), zinc (Zn), indium (In) or any combination thereof.

The anode current collector may include at least one of nickel (Ni), copper (Cu), stainless steel (SUS) or any combination thereof.

The metal nanoparticle layer may be formed through sputtering.

Another embodiment of the present disclosure provides an anode-free all-solid-state battery, including a cathode, the current collector described above, and a solid electrolyte layer interposed between the cathode and the current collector, in which the average particle diameter (D50) of a lithiophilic metal in the metal nanoparticle layer may be smaller than the average particle diameter (D50) of an electrolyte in the solid electrolyte layer.

Still another embodiment of the present disclosure provides a method of manufacturing a current collector for an anode-free all-solid-state battery, including preparing the anode current collector and forming the metal nanoparticle layer by depositing the lithiophilic metal through sputtering on one surface of the anode current collector with a power of 20 to 50 W.

The metal nanoparticle layer may be configured such that the lithiophilic metal is distributed in the form of particles.

BRIEF DESCRIPTION OF THE FIGURES

The above and other features of the present disclosure will now be described in detail with reference to certain exemplary embodiments thereof illustrated in the accompanying drawings, which are given hereinbelow by way of illustration only, and thus are not limitative of the present disclosure, and wherein.

DETAILED DESCRIPTION

Figure 1A:
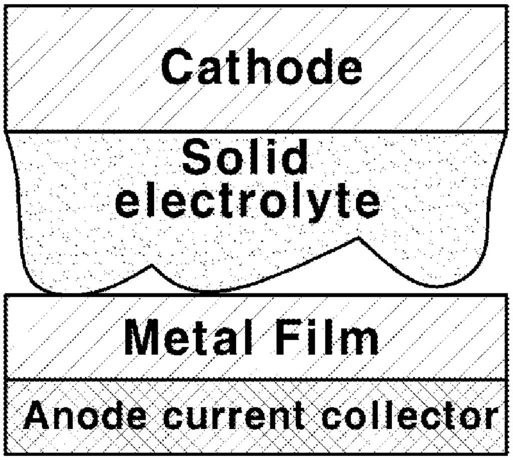
FIGS. 1A, 1B, and 1C schematically show a non-uniform lithium precipitation mechanism during charging of an anode-free all-solid-state battery to which an anode current collector having a metal film is applied.

The above and other objects, features and advantages of the present disclosure will be more clearly understood from the following preferred embodiments taken in conjunction with the accompanying drawings. However, the present disclosure is not limited to the embodiments disclosed herein, and may be modified into different forms. These embodiments are provided to thoroughly explain the disclosure and to sufficiently transfer the spirit of the present disclosure to those skilled in the art.

Throughout the drawings, the same reference numerals will refer to the same or like elements. For the sake of clarity of the present disclosure, the dimensions of structures are depicted as being larger than the actual sizes thereof. It will be understood that, although terms such as "first", "second", etc. may be used herein to describe various elements, these elements are not to be limited by these terms. These terms are only used to distinguish one element from another element. For instance, a "first" element discussed below could be termed a "second" element without departing from the scope of the present disclosure. Similarly, the "second" element could also be termed a "first" element. As used herein, the singular forms are intended to include the plural forms as well, unless the context clearly indicates otherwise.

It will be further understood that the terms "comprise", "include", "have", etc., when used in this specification, specify the presence of stated features, integers, steps, operations, elements, components, or combinations thereof, but do not preclude the presence or addition of one or more other features, integers, steps, operations, elements, components, or combinations thereof. Also, it will be understood that when an element such as a layer, film, area, or sheet is referred to as being "on" another element, it may be directly on the other element, or intervening elements may be present therebetween. Similarly, when an element such as a layer, film, area, or sheet is referred to as being "under" another element, it may be directly under the other element, or intervening elements may be present therebetween.

Unless otherwise specified, all numbers, values, and/or representations that express the amounts of components, reaction conditions, polymer compositions, and mixtures used herein are to be taken as approximations including various uncertainties affecting measurement that inherently occur in obtaining these values, among others, and thus should be understood to be modified by the term "about" in all cases. Furthermore, when a numerical range is disclosed in this specification, the range is continuous, and includes all values from the minimum value of said range to the maximum value thereof, unless otherwise indicated. Moreover, when such a range pertains to integer values, all integers including the minimum value to the maximum value are included, unless otherwise indicated.

Figure 1B:
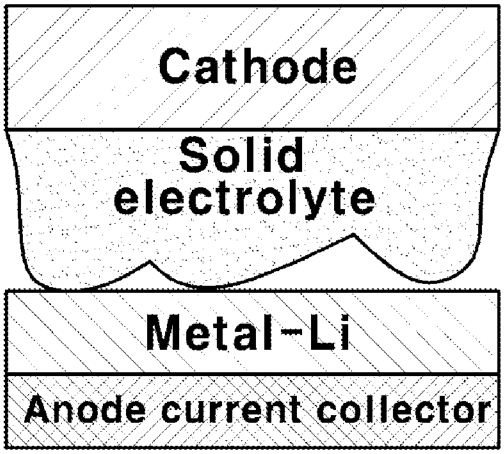
Figure 1C:
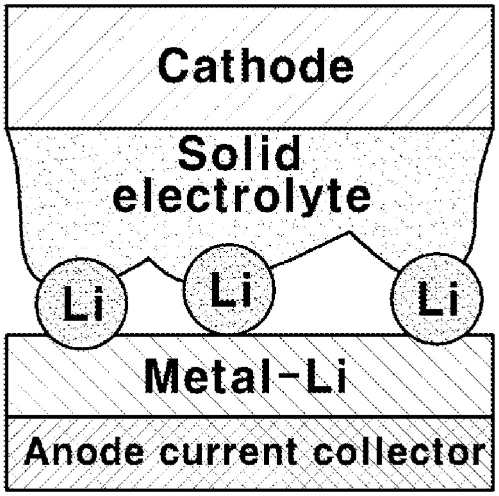

FIGS. 1A-1C schematically show a non-uniform lithium precipitation mechanism during charging of an anode-free all-solid-state battery to which an anode current collector having a metal film is applied.

As shown in FIG. 1A, a metal film made of a lithiophilic metal is provided on the anode current collector, and a solid electrolyte is disposed between the cathode and the anode current collector. As shown in FIG. 1B, as charging proceeds, the lithiophilic metal of the metal film reacts with lithium ions to form an alloy. Since the solid electrolyte has an irregular particle size and the metal film has greater hardness due to alloying, voids are inevitably formed between the solid electrolyte and the alloyed metal film, and the alloyed metal film and the solid electrolyte come into contact with each other in a localized area. As shown in FIG. 1C, as charging proceeds, lithium is precipitated only in the portion where the solid electrolyte and the alloyed metal film are in physical contact, and a non-uniform interface is formed between the solid electrolyte and the alloyed metal film, and thus, there is a technical limit to the improvement of energy density.

The present inventors have thoroughly studied methods of effectively increasing the physical contact area between the solid electrolyte and the current collector and effectively reducing interfacial voids between the electrolyte and the current collector, thus culminating in the present disclosure.

Hereinafter, a detailed description will be given of a current collector for an anode-free all-solid-state battery according to an aspect of the present disclosure.

Figure 2A:
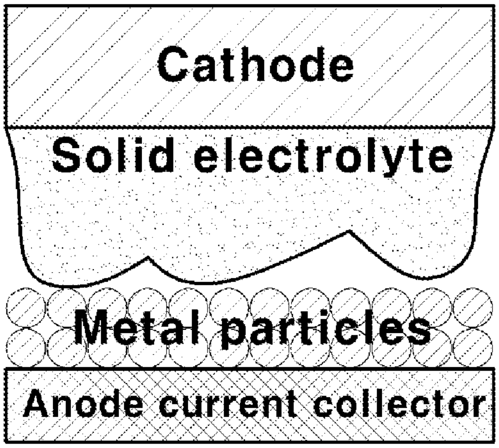
FIGS. 2A, 2B, and 2C schematically show an electrochemical reaction during charging of an anode-free all-solid-state battery to which a current collector for an anode-free all-solid-state battery according to an aspect of the present disclosure is applied.
Figure 2B:
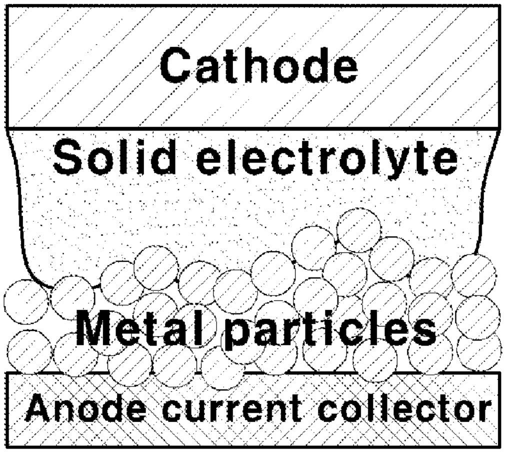
Figure 2C:
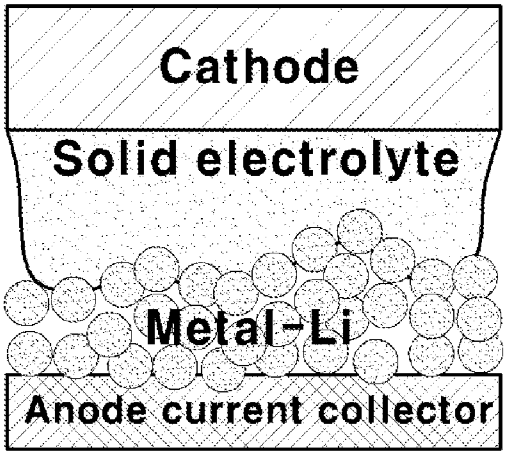

FIGS. 2A to 2C schematically show an electrochemical reaction during charging of an anode-free all-solid-state battery to which a current collector for an anode-free all-solid-state battery according to an aspect of the present disclosure is applied.

As shown in FIG. 2A, the current collector for an anode-free all-solid-state battery according to an aspect of the present disclosure may include an anode current collector and a metal nanoparticle layer disposed on one surface of the anode current collector and configured such that lithiophilic metal is uniformly distributed in the form of particles.

The anode current collector is not particularly limited, so long as it is made of a material that does not react electrochemically with lithium ions and is lithiophobic, and is preferably made of any one material selected from the group consisting of nickel (Ni), copper (Cu), stainless steel (SUS), and combinations thereof.

The anode current collector may be a plate-shaped substrate having electrical conductivity, and may be a high-density metal thin film having a porosity of less than about 1%. As a non-limiting example, the thickness of the anode current collector may be 1 to 20 μm, preferably 5 to 15 μm.

The metal nanoparticle layer of the present disclosure may be provided on one surface of the anode current collector, and may be configured such that lithiophilic metal is uniformly distributed in the form of particles. Here, "uniformly distributed in the form of particles" may mean that the lithiophilic metal forms the metal nanoparticle layer while maintaining a particle shape even in a final product.

The shape of the particles is not particularly limited, but may be spherical, elliptical, elongated rod, irregular, etc., preferably spherical.

The lithiophilic metal is not particularly limited, but is preferably any one selected from the group consisting of silver (Ag), magnesium (Mg), tin (Sn), bismuth (Bi), zinc (Zn), indium (In), and combinations thereof.

The metal nanoparticle layer of the present disclosure may be formed by sputtering a lithiophilic metal, and may be provided in the form of a thin film layer in which metal particles having a limited particle size are uniformly distributed by controlling power in a specific range during sputtering.

As shown in FIG. 2B, as charging proceeds, the lithiophilic metal particles move in a manner of filling voids formed between the solid electrolyte and the metal nanoparticle layer, such that a physical contact area between the metal nanoparticle layer and the solid electrolyte may be effectively increased. As shown in FIG. 2C, as charging proceeds, the lithiophilic metal particles contained in the metal nanoparticle layer are alloyed in a state in which a uniform interface is formed with the solid electrolyte, such that precipitation of lithium in a localized area may be effectively suppressed.

The average particle diameter (D50) of the lithiophilic metal included in the metal nanoparticle layer is preferably 50 to 200 nm. If the average particle diameter (D50) of the lithiophilic metal is less than 50 nm, the effect caused when the lithiophilic metal is maintained in the form of particles may not be sufficient. On the other hand, if the average particle diameter (D50) of the lithiophilic metal exceeds 200 nm, voids may be excessively generated in the metal nanoparticle layer, and the effect of filling the voids between the metal nanoparticle layer and the solid electrolyte layer may not be sufficient. The average particle diameter (D50) may be measured using a commercially available laser diffraction scattering-type particle size distribution analyzer, for example, a micro track particle size distribution analyzer. Alternatively, 200 particles may be randomly extracted from the electron microscope image and the average particle diameter thereof may be calculated.

The thickness of the metal nanoparticle layer is not particularly limited, but a preferred thickness of the metal nanoparticle layer is 100 to 1000 nm. If the thickness of the metal nanoparticle layer is less than 100 nm, the effect of forming the lithiophilic metal thin film may not be sufficient. On the other hand, if the thickness of the metal nanoparticle layer exceeds 1000 nm, a desired effect cannot be achieved due to excessive growth of lithiophilic metal particles.

An anode-free all-solid-state battery according to another aspect of the present disclosure may include a cathode, the current collector as described above, and a solid electrolyte layer interposed between the cathode and the current collector.

In order to suppress void formation between the solid electrolyte and the metal nanoparticle layer and to form a uniform interface therebetween, it is preferred that the average particle diameter (D50) of the lithiophilic metal included in the metal nanoparticle layer be smaller than the average particle diameter (D50) of the electrolyte included in the solid electrolyte layer.

Below is a detailed description of a method of manufacturing the current collector for an anode-free all-solid-state battery according to an aspect of the present disclosure.

The method of manufacturing the current collector for an anode-free all-solid-state battery according to an aspect of the present disclosure may include preparing an anode current collector and forming a metal nanoparticle layer by depositing a lithiophilic metal through sputtering on one surface of the anode current collector.

The sputtering process used in forming the metal nanoparticle layer is not particularly limited, and a sputtering process commonly used in depositing a metal thin film may be performed. Preferably, the metal nanoparticle layer is formed through any one process selected from among DC sputtering and RF sputtering.

Here, it is important to adjust the sputtering power to form the metal nanoparticle layer in which the lithiophilic metal is distributed in the form of particles. Sputtering uses a phenomenon in which, when ions having certain energy transfer energy to atoms around the collision by colliding with a source material, if the energy is greater than the binding force between the atoms, some of the atoms break the bond and bounce out to be deposited on the substrate. Therefore, atoms constituting the source material may be deposited on the substrate in the form of particles only when ions having appropriate intensity collide with the source material.

According to the present disclosure, when forming the metal nanoparticle layer, it is preferable to limit the sputtering power to the range of 20 to 50 W. If the sputtering power is less than 20 W, it may be difficult for atoms released from the source material of the lithiophilic metal to be deposited in the form of particles on the anode current collector. On the other hand, if the sputtering power exceeds 50 W, the lithiophilic metal particles may grow excessively, and the effect of filling the voids between the metal nanoparticle layer and the solid electrolyte layer may not be sufficient.

A better understanding of the present disclosure may be obtained through the following examples and comparative examples. However, these examples are merely set forth to illustrate the present disclosure, and are not to be construed as limiting the scope of the present disclosure.

Test Example 1

Figure 3:
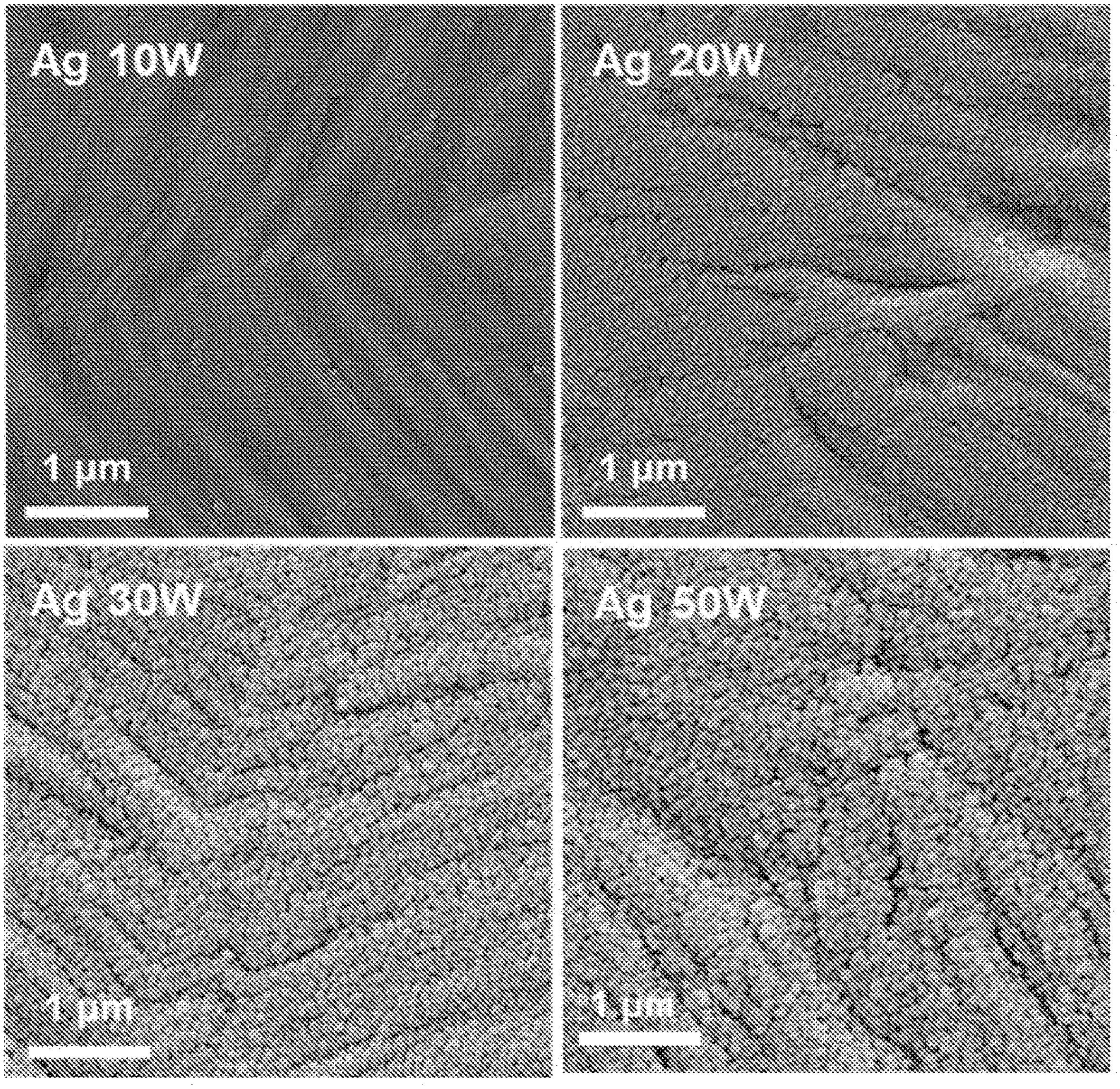
FIGS. 3 and 4 show scanning electron microscope (SEM) images of the surfaces of silver (Ag) thin films formed on specimens.
Figure 4:
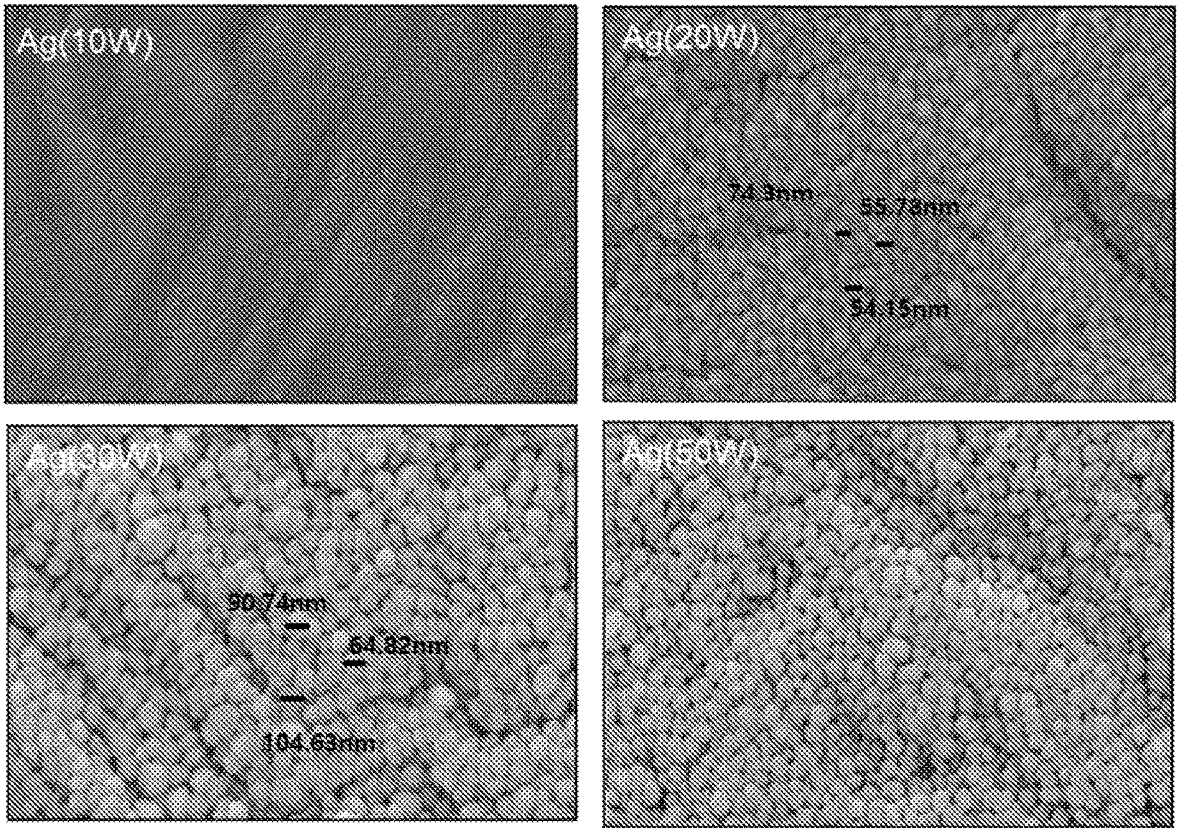

A specimen was manufactured in a manner that a 10 μm thick anode current collector made of SUS316 was prepared and then subjected to DC sputtering to form a silver (Ag) thin film on the surface of the anode current collector. Here, the sputtering power was set to 10 W, 20 W, 30 W, and 50 W when manufacturing the specimen. The surface of the thin film formed on each specimen was observed using a scanning electron microscope (SEM), and the results thereof are shown in FIGS. 3 and 4. FIGS. 3 and 4 show images of the specimens measured at different magnifications.

As shown in FIGS. 3 and 4, in the specimens to which a sputtering power of 10 W was applied, distribution in the form of particles was insignificant, whereas in the specimens to which powers of 20 W, 30 W, and 50 W were applied, silver (Ag) was maintained in the form of particles and uniformly distributed. Also, in the specimens to which powers of 20 W, 30 W, and 50 W were applied, respective average particle diameters (D50) of silver (Ag) were 61.41 nm, 86.73 nm, and 108.32 nm, satisfying the particle diameter range of 50 to 200 nm.

Based on results of observing the cross-section of each specimen using a scanning electron microscope (SEM), in the specimen using a sputtering power of 10 W, the metal nanoparticle layer was seldom formed, making it impossible to determine the thickness of the metal nanoparticle layer. In the specimens using powers of 20 W, 30 W, and 50 W, respective thicknesses of the thin films were determined to be 256.3 nm, 269.0 nm, and 341.5 nm.

Test Example 2

Figure 5:
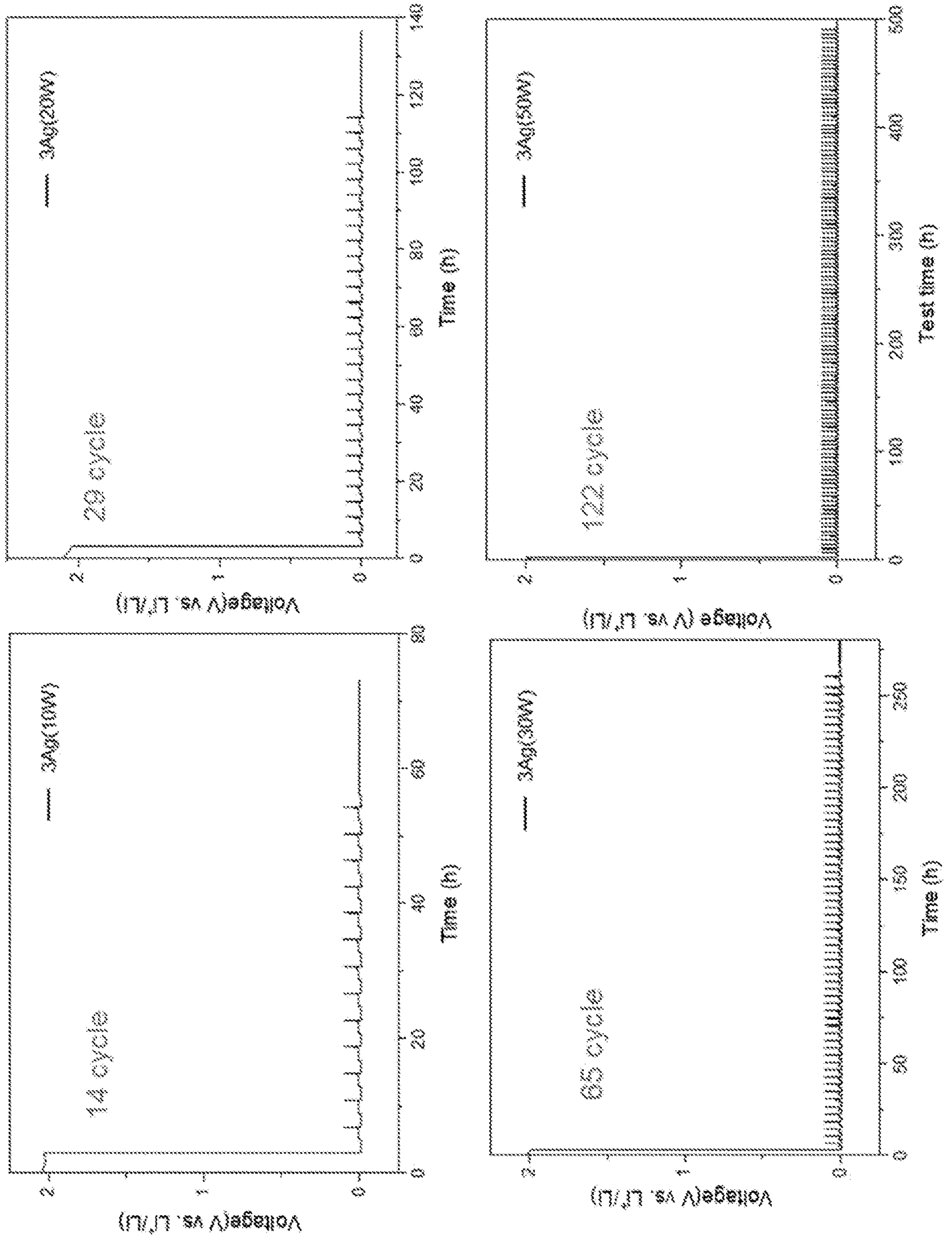
FIG. 5 shows results of evaluating cycle characteristics of a symmetrical cell manufactured using each specimen of Test Example 1.
Figure 6:
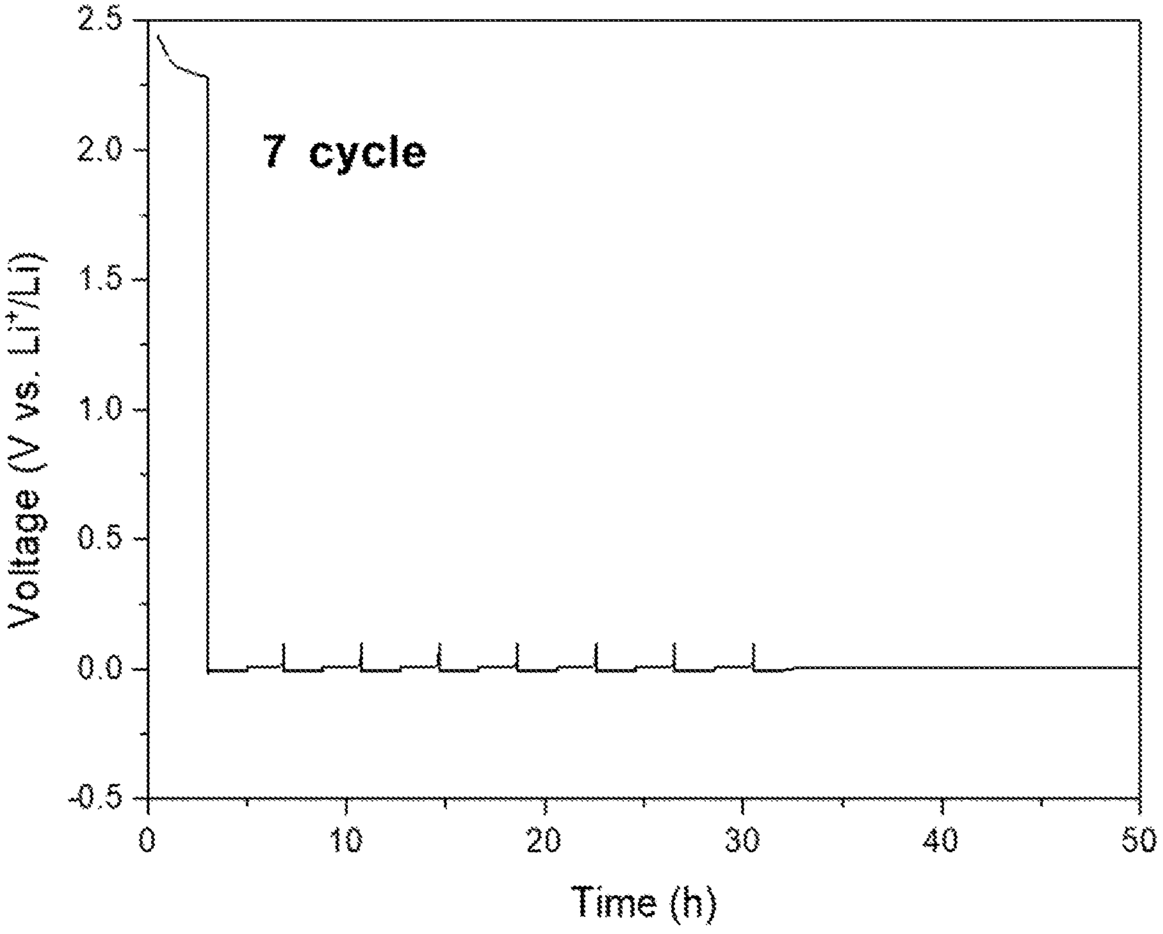
FIG. 6 shows results of evaluating the cycle of a symmetrical cell manufactured using an anode current collector without a metal nanoparticle layer.

An all-solid-state battery was manufactured by laminating a solid electrolyte and a cathode using each specimen of Test Example 1 as an anode current collector. Also, for performance comparison with the anode current collector having the metal nanoparticle layer, an all-solid-state battery using SUS316 without a metal nanoparticle layer as an anode current collector was additionally manufactured. A current density of 1 $mA/cm^2$, a deposition capacity of 2 $mAh/cm^2$, and a cell operation temperature of 50° C. were applied, and the cycle life evaluation results thereof are shown in FIGS. 5 and 6. As shown in FIGS. 5 and 6, it can be confirmed that the cycle life of FIG. 5 with the metal nanoparticle layer was increased compared to FIG. 6 without the metal nanoparticle layer. In addition, as shown in FIG. 5, it can be confirmed that the cycle life tended to increase with an increase in the sputtering power. When the metal nanoparticle layer was formed by performing sputtering with a power of 20 to 50 W, the efficiency was greatly improved by increasing the physical contact area between the solid electrolyte and the metal nanoparticle layer.

Test Example 3

Figure 7:
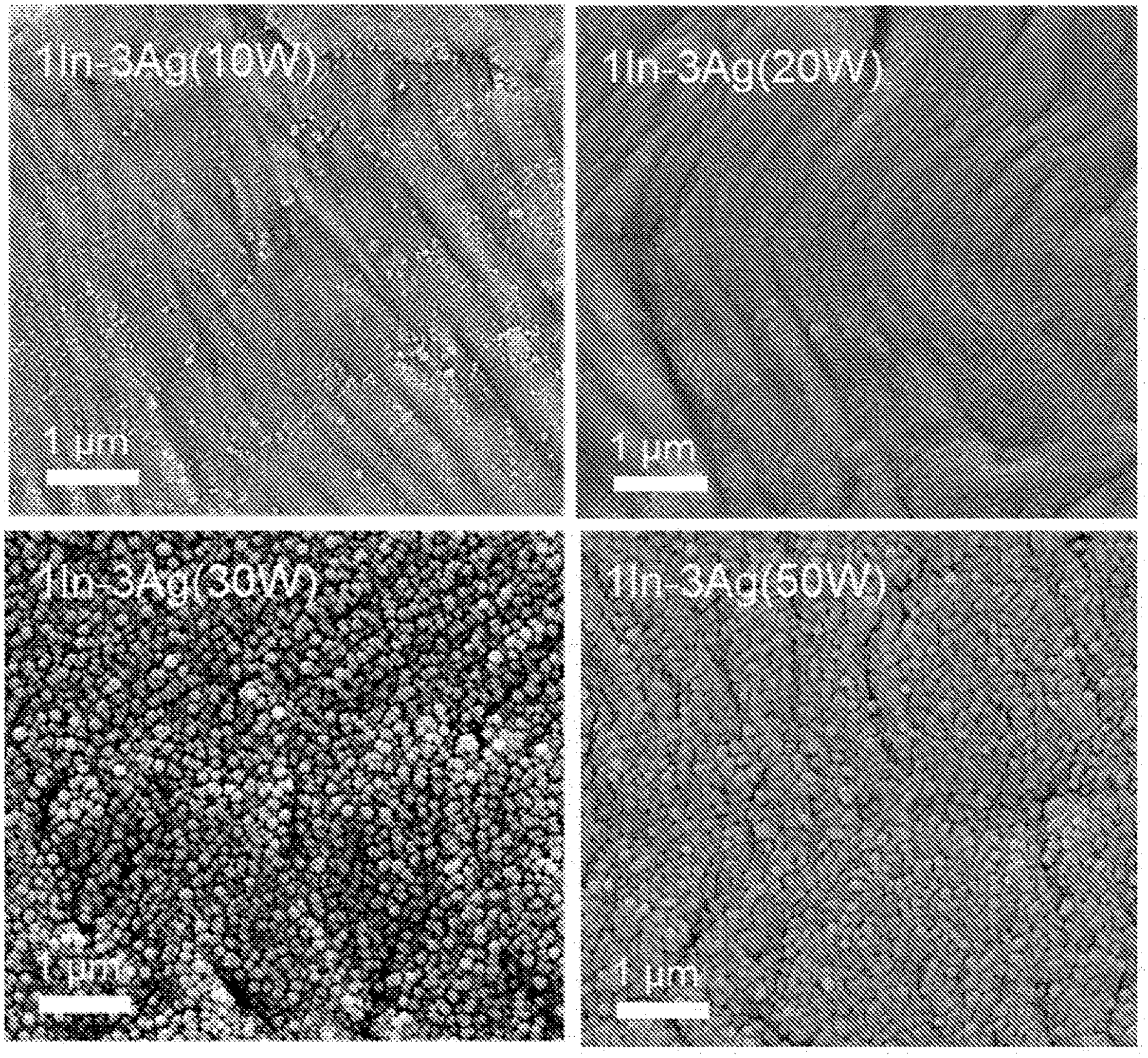
FIGS. 7 and 8 show SEM images of the surfaces of indium (In)-silver (Ag) mixed thin films formed on specimens.
Figure 8:
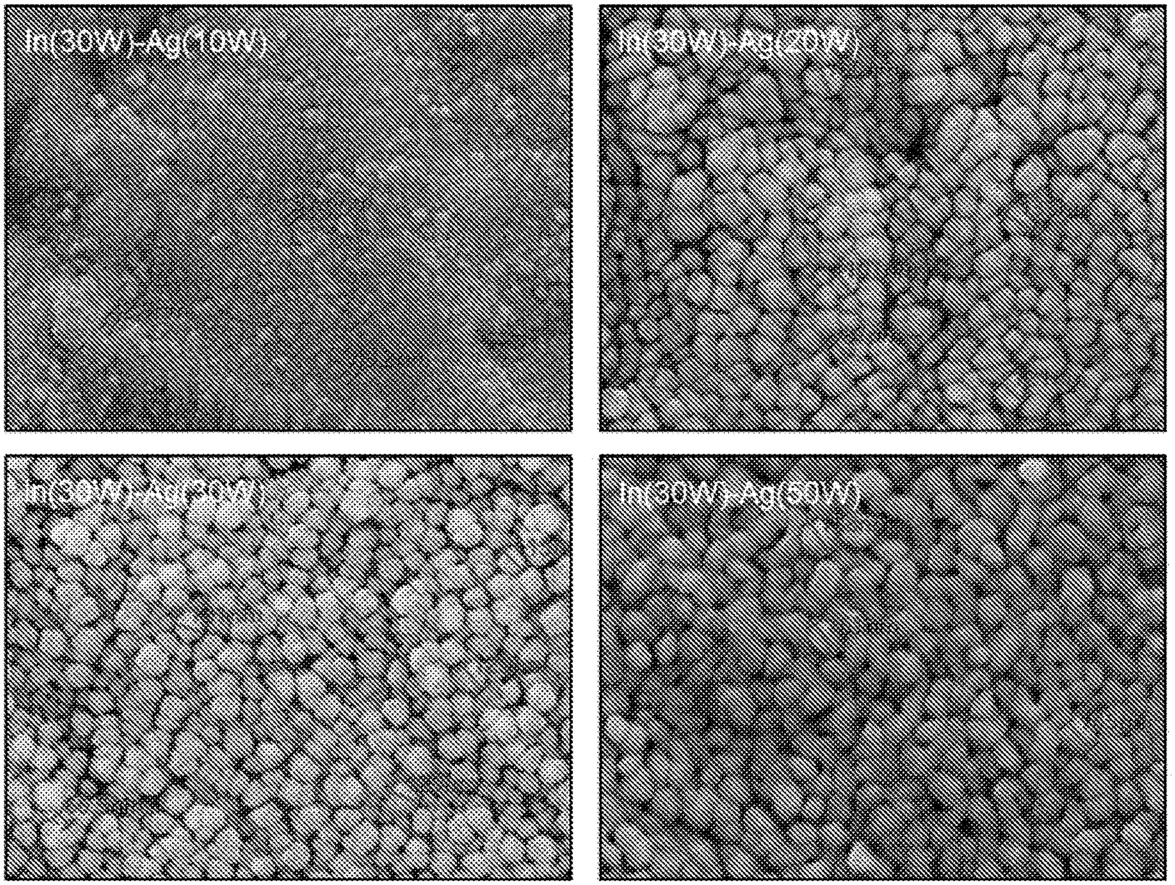
Figure 9:
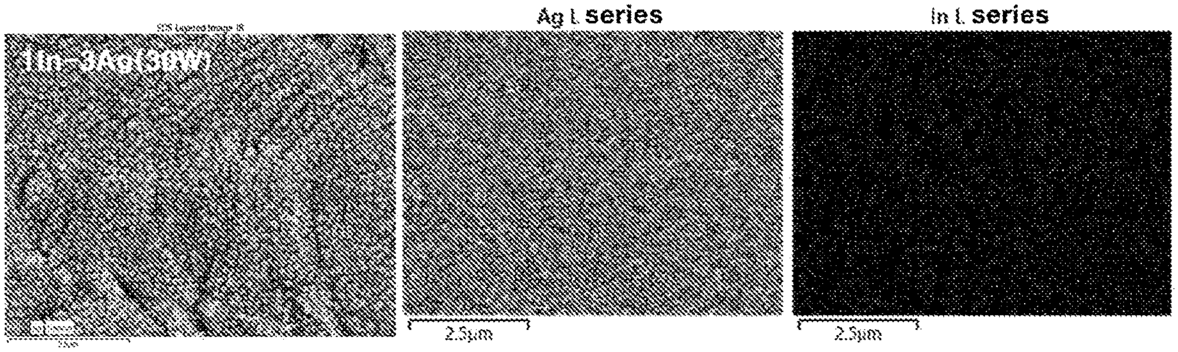
FIG. 9 shows SEM and EDS images of the surface of an indium (In)-silver (Ag) mixed thin film.

A specimen was manufactured in a manner that a 10 μm thick anode current collector made of SUS316 was prepared and then subjected to DC sputtering to form an indium (In)-silver (Ag) mixed thin film on the surface of the anode current collector. Here, the sputtering power was set to 10 W, 20 W, 30 W, and 50 W when manufacturing the specimen. The surface of the thin film formed on each specimen was observed using a scanning electron microscope (SEM), and the results thereof are shown in FIGS. 7 and 8. FIGS. 7 and 8 show images of the specimens measured at different magnifications. Also, FIG. 9 shows SEM and EDS images of the surface of the specimen at a power of 30 W, confirming that silver (Ag) and indium (In) were uniformly distributed.

As shown in FIGS. 7 and 8, in the specimens to which a sputtering power of 10 W was applied, distribution in the form of particles was insignificant, whereas in the specimens to which powers of 20 W, 30 W, and 50 W were applied, indium (In) and silver (Ag) in the form of particles were uniformly distributed. In addition, in the specimen to which the power of 10 W was applied, the average diameter of the indium (In) and silver (Ag) in the form of particles was 45.5 nm, which did not satisfy the range of 50 to 200 nm. However, in the specimens to which powers of 20 W, 30 W, and 50 W were applied, respective average diameters of indium (In) and silver (Ag) in the form of particles were 162.0 nm, 114.1 nm, and 154.7 nm, satisfying the range of 50 to 200 nm.

Based on results of observing the cross-section of each specimen using a scanning electron microscope (SEM), the thicknesses of the thin films in the specimens to which powers of 10 W, 20 W, 30 W, and 50 W were applied were determined to be 271.0 nm, 259.0 nm, 270.8 nm, and 400.3 nm, respectively.

Test Example 4

Figure 10:
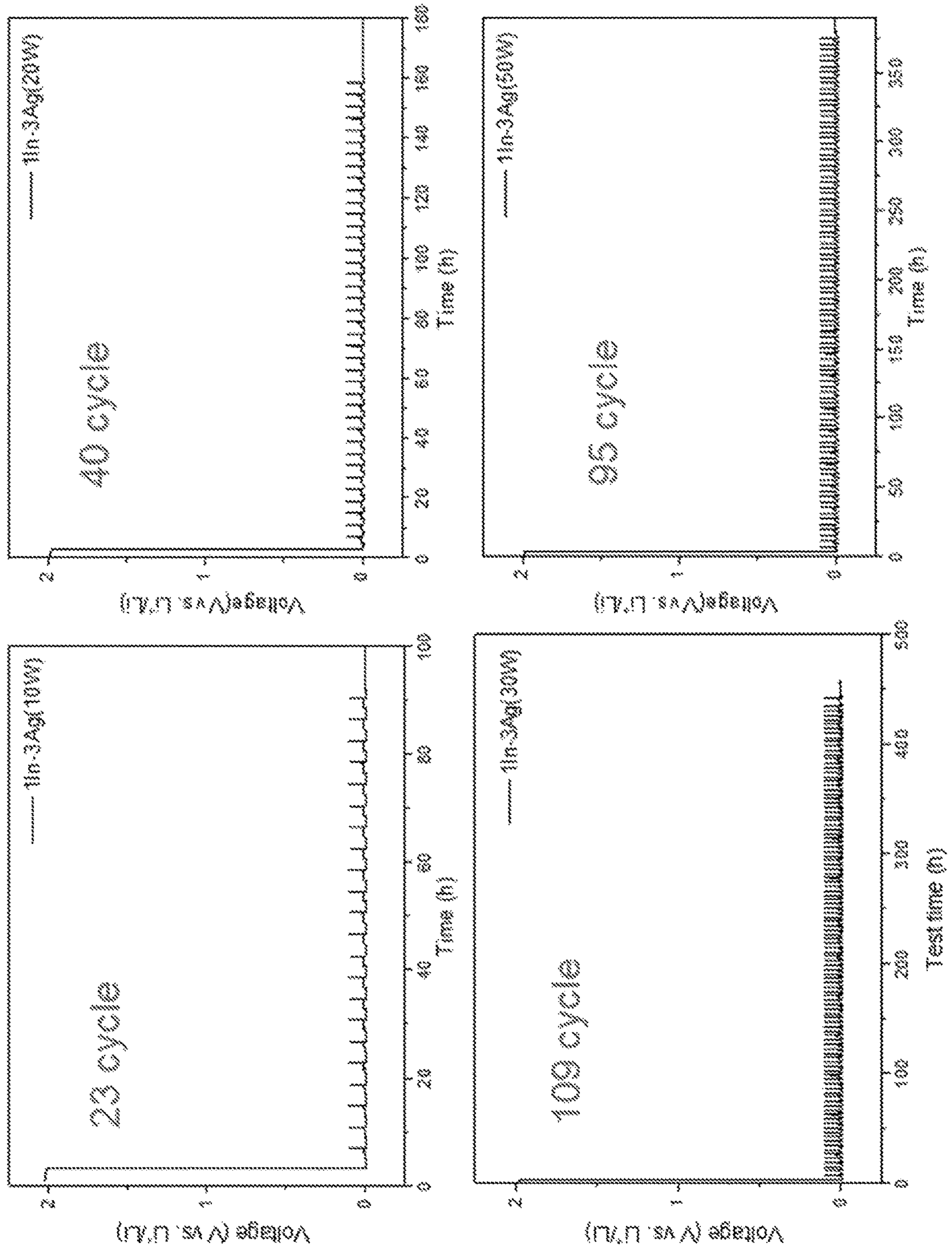
FIG. 10 shows results of evaluating cycle characteristics of a symmetrical cell manufactured using each specimen of Test Example 3.

An all-solid-state battery was manufactured by laminating a solid electrolyte and a cathode using each specimen of Test Example 3 as an anode current collector. A current density of 1 $mA/cm^2$, a deposition capacity of 2 $mAh/cm^2$, and a cell operation temperature of 50° C. were applied, and the cycle life evaluation results thereof are shown in FIG. 10. As shown in FIG. 10, when the metal nanoparticle layer was formed by performing sputtering with a power of 20 to 50 W, the efficiency was greatly improved by increasing the physical contact area between the solid electrolyte and the metal nanoparticle layer.

Therefore, the current collector for an anode-free all-solid-state battery according to an aspect of the present disclosure is capable of effectively increasing the physical contact area between the electrolyte and the current collector and effectively reducing the interfacial voids between the electrolyte and the current collector, and the anode-free all-solid-state battery manufactured using the same is capable of stably increasing cycle life without overvoltage.

As is apparent from the above description, a current collector for an anode-free all-solid-state battery according to an aspect of the present disclosure can effectively increase the physical contact area between the electrolyte and the current collector and can effectively reduce interfacial voids between the electrolyte and the current collector.

An anode-free all-solid-state battery according to another aspect of the present disclosure can stably increase cycle life without overvoltage.

The effects of the present disclosure are not limited to the above-mentioned effects. It should be understood that the effects of the present disclosure include all effects that can be inferred from the description of the present disclosure.

As described above, although the examples have been described with reference to the limited embodiments and drawings, various modifications and variations are possible from the above description by those skilled in the art. For example, even if the described techniques are performed in an order different from the described method, and/or the described components are coupled or combined in a different form from the described method, or are replaced or substituted by other components or equivalents, appropriate results may be achieved. Therefore, other implementations, other embodiments, and equivalents to the claims also fall within the scope of the following claims.

The invention claimed is:

1. A current collector for an anode-free all-solid-state battery, comprising:

an anode current collector; and a metal nanoparticle layer disposed on one surface of the anode current collector;

wherein the metal nanoparticle layer consists essentially of a lithiophilic metal.

2. The current collector of claim 1, wherein the lithiophilic metal is present in a shape of particles in the metal nanoparticle layer.

3. The current collector of claim 2, wherein an average particle diameter (D50) of the lithiophilic metal is 50 to 200 nm.

4. The current collector of claim 1, wherein a thickness of the metal nanoparticle layer is 100 to 1000 nm.

5. The current collector of claim 1, wherein the lithiophilic metal comprises at least one of silver (Ag), magnesium (Mg), tin (Sn), bismuth (Bi), zinc (Zn), indium (In) or any combination thereof.

6. The current collector of claim 1, wherein the anode current collector comprises at least one of nickel (Ni), copper (Cu), stainless steel (SUS) or any combination thereof.

7. The current collector of claim 1, wherein the metal nanoparticle layer is formed through sputtering.

8. An anode-free all-solid-state battery, comprising:

a cathode;

the current collector of claim 1; and a solid electrolyte layer interposed between the cathode and the current collector;

wherein an average particle diameter (D50) of the lithiophilic metal in the metal nanoparticle layer is smaller than an average particle diameter (D50) of an electrolyte in the solid electrolyte layer.

9. A method of manufacturing a current collector for an anode-free all-solid-state battery, comprising:

preparing an anode current collector; and forming a metal nanoparticle layer by depositing a lithiophilic metal through sputtering on one surface of the anode current collector with a power of 20 to 50 W.

10. The method of claim 9, wherein the metal nanoparticle layer is configured such that the lithiophilic metal is distributed in a form of particles.

11. The method of claim 10, wherein an average particle diameter (D50) of the lithiophilic metal is 50 to 200 nm.

12. The method of claim 9, wherein a thickness of the metal nanoparticle layer is 100 to 1000 nm.

13. The method of claim 9, wherein the lithiophilic metal comprises at least one of silver (Ag), magnesium (Mg), tin (Sn), bismuth (Bi), zinc (Zn), indium (In) or any combination thereof.

14. The method of claim 9, wherein the anode current collector comprises at least one of nickel (Ni), copper (Cu), stainless steel (SUS) or any combination thereof.

* * * * *